(12) United States Patent
Moon

(10) Patent No.: US 11,881,680 B2
(45) Date of Patent: Jan. 23, 2024

(54) LASER MODULE AND ASSEMBLY METHOD THEREFOR

(71) Applicant: Sang Pil Moon, Seoul (KR)

(72) Inventor: Sang Pil Moon, Seoul (KR)

( * ) Notice: Subject to any disclaimer, the term of this patent is extended or adjusted under 35 U.S.C. 154(b) by 846 days.

(21) Appl. No.: 16/944,163

(22) Filed: Jul. 31, 2020

(65) Prior Publication Data

US 2020/0366055 A1 Nov. 19, 2020

Related U.S. Application Data

(63) Continuation of application No. PCT/CN2018/074807, filed on Jan. 31, 2018.

(51) Int. Cl.
| | |
|---|---|
| *H01S 5/02253* | (2021.01) |
| *H01S 5/024* | (2006.01) |
| *H01S 5/02326* | (2021.01) |
| *H01S 5/02257* | (2021.01) |
| *H01S 5/00* | (2006.01) |

(52) U.S. Cl.
CPC ...... *H01S 5/02253* (2021.01); *H01S 5/02257* (2021.01); *H01S 5/02326* (2021.01); *H01S 5/02469* (2013.01); *H01S 5/005* (2013.01)

(58) Field of Classification Search
CPC .................................................. H01S 5/02257
See application file for complete search history.

(56) References Cited

U.S. PATENT DOCUMENTS

| | | | |
|---|---|---|---|
| 4,918,702 A * | 4/1990 | Kimura | B41J 2/471 |
| | | | 372/101 |
| 5,878,073 A | 3/1999 | Wu | |
| 2012/0104526 A1* | 5/2012 | Olsen | H01L 27/14618 |
| | | | 257/E31.127 |
| 2017/0063032 A1* | 3/2017 | Morizumi | H01S 5/0087 |

FOREIGN PATENT DOCUMENTS

JP 2009164427 A 7/2009

OTHER PUBLICATIONS

International Search Report of PCT Patent Application No. PCT/CN2018/074807 dated Sep. 29, 2018.

* cited by examiner

*Primary Examiner* — Tuan N Nguyen

(57) ABSTRACT

The present invention provides a laser module and an assembly method therefor. The laser module is mainly consisted of a lens module configured to be installed in an inner cavity of the height adjustment barrel through an end of the height adjustment barrel and a heat sink threadingly connected with another end of the height adjustment barrel. The laser module is configured in such a manner that a laser diode received in an inner cavity of the heat sink and a lens accommodated within the lens module are aligned along a same optical axis, and the height adjustment barrel is configured to adjust a focal length between the laser diode and the lens.

8 Claims, 2 Drawing Sheets

LASER MODULE AND ASSEMBLY METHOD THEREFOR

CROSS REFERENCE TO RELATED APPLICATIONS

The present application is a Continuation Application of PCT Application No. PCT/CN2018/074807 filed on Jan. 31, 2018, the contents of which are incorporated herein by reference in their entirety.

TECHNICAL FIELD

The present invention relates to a laser module and an assembly method therefor.

BACKGROUND

To achieve light diffusion by means of a lens, existing lamps are usually configured to provide one lens for each LED. Thus, the manufacturing process is complicated and costly.

SUMMARY

Technical Problem

The present invention in an aspect aims to provide a laser module, which can adjust a focal length between the laser diode and the lens to achieve a focusing function, shine with dots of colored light and emit beams of light as beautiful as star lights in the sky, and can be assembled into lamps. The present invention also aims to provide an assembly method therefor.

Technical Solution

The present invention provides a technical solution of a laser module, characterized in that a heat sink and a lens module are configured to be installed in an inner cavity of the height adjustment barrel respectively through two ends of the height adjustment barrel. The laser module is configured in such a manner that a laser diode received in an inner cavity of the heat sink and a lens accommodated within the lens module are aligned along a same optical axis, and the height adjustment barrel is configured to adjust a focal length between the laser diode and the lens.

Preferably, the lens module is mainly consisted of a lamp body and components disposed in an inner cavity of the lamp body in sequence. The components include a transparent protective plate covering an opening end of a lens holder, a light diffusion plate, the lens holder, a lens embedded at a bottom portion of the lens holder, and a hold-down ring.

Preferably, a bottom portion of an inner wall of the lens holder is recessed to form an annular mounting groove, a bottom portion of the lens is formed with an annular stepped portion, and the stepped portion of the lens is engaged in the mounting groove of the lens holder.

Preferably, the height adjustment barrel and the heat sink are threadingly connected.

Preferably, an annular groove is formed by recessing at a position where the lens module is disposed on an inner wall of the height adjustment barrel, and a protruding annular portion is formed by protruding at a position corresponding to the annular groove of the height adjustment barrel on an outer circumferential wall of the lamp body. Further, the protruding annular portion of the lamp body is engaged in the annular groove of the height adjustment barrel, such that the lamp body is fixedly arranged in the height adjustment barrel.

Preferably, the hold-down ring, which is disposed on a side of the lens holder, has an outer circumferential wall protruding to form an arc-shaped protruding annular ridge, and an annular recess is formed at a corresponding position on an inner wall of the lamp body. Further, the protruding annular ridge of the hold-down ring is engaged in the annular recess of the lamp body such that the hold-down ring is fixedly arranged on the lamp body.

Preferably, the heat sink is mainly consisted of a sleeve, a stepped portion radially extending at an end of the sleeve, an inner shoulder formed with a decreased diameter at a middle portion of the sleeve, and a laser diode accommodation cavity formed with an increasing diameter at a portion of the inner shoulder proximal to the stepped portion.

Preferably, the stepped portion of the heat sink is provided with screw holes extending in parallel with the axis.

The present invention provides another technical solution of a method for assembling a laser module, characterized in that the method comprises steps as follows.

Installing a transparent protective plate, a light diffusion plate, a lens holder, a lens, and a hold-down ring in an inner cavity of the lamp body in sequence, wherein the protruding annular ridge of the hold-down ring is engaged in the annular recess of the lamp body, such that the hold-down ring is fixedly arranged on the lamp body to assemble a lens module.

Installing the lens module through an end of the height adjustment barrel in such a manner that the protruding annular portion of the lamp body is engaged in the annular groove of the height adjustment barrel, such that the lens module is fixedly arranged in the height adjustment barrel.

Pressing the laser diode into the heat sink, and threading external threads of the heat sink into internal threads of the height adjustment barrel.

Adjusting a focal length between the laser diode and the lens by threads, to achieve optimized illumination effect.

Advantages

It achieves convenient adjustment of the focal length to realize optimized illumination effect.

It achieves good dissipation of the heat generated during the operation of the light emitting diode. Thus, the temperature of the light emitting diode is reduced, and service life of the lamp can be increased.

It has small size and can be easily mounted. It is applicable for using within various lamps and has good applicability.

Figure 1:
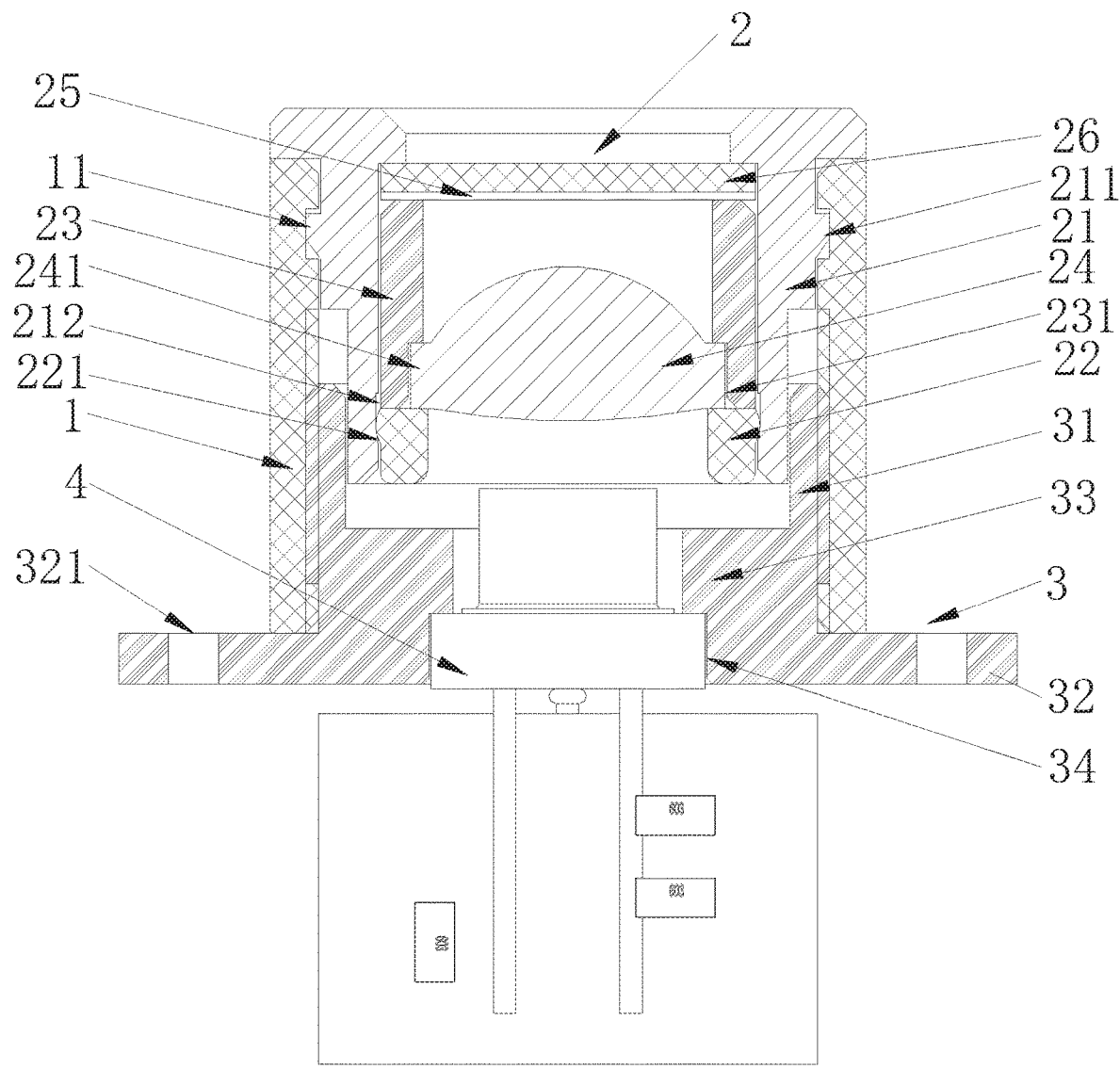
FIG. 1 is a schematic drawing of a laser module according to an embodiment of the present invention.

The reference numerals of main components are as follows.

Table 1

Height adjustment barrel 1; annular groove 11; lens module 2; lamp body 21; protruding annular portion 211; annular recess 212; hold-down ring 22; protruding annular ridge 221; lens holder 23; mounting groove 231; lens 24; stepped portion 241; light diffusion plate 25; transparent protective plate 26; heat sink 3; sleeve 31; stepped portion 32; screw holes 321; inner shoulder 33; accommodation cavity 34; laser diode 4.

DETAILED DESCRIPTION OF ILLUSTRATED EMBODIMENTS

The present invention will be further described below in detail with reference to the accompany drawings.

FIG. 1 illustrates an embodiment of the present invention.

Referring to FIG. 1, the laser module is mainly consisted of a lens module 2 configured to be installed in an inner cavity of the height adjustment barrel through an end of the height adjustment barrel 1 and a heat sink 3 threadingly connected with another end of the height adjustment barrel 1, the laser module is configured in such a manner that a laser diode 4 received in an inner cavity of the heat sink 3 and a lens 24 accommodated within the lens module 2 are aligned along a same optical axis, and the height adjustment barrel 1 is configured to adjust a focal length between the laser diode 4 and the lens 24.

In the embodiment, the lens module 2 is mainly consisted of a lamp body 21 and components disposed in an inner cavity of the lamp body 21 in sequence. The components include a transparent protective plate 26 covering an opening end of a lens holder 23, a light diffusion plate 25, the lens holder 23, a lens 24 embedded at a bottom portion of the lens holder 23, and a hold-down ring 22.

In the embodiment, a bottom portion of an inner wall of the lens holder 23 is recessed to form an annular mounting groove 231, a bottom portion of the lens 24 is formed with an annular stepped portion 241, and the stepped portion 241 of the lens 24 is engaged in the mounting groove 231 of the lens holder 23.

In the embodiment, a portion of an inner wall of the height adjustment barrel 1, at a position where the lens module 2 is disposed, is recessed to form an annular groove 11. Further, a portion of an outer circumferential wall of the lamp body 21, at a position corresponding to the annular groove 11 of the height adjustment barrel 1, protrudes to form a protruding annular portion 211. Further, the protruding annular portion 211 of the lamp body is engaged in the annular groove 11 of the height adjustment barrel, such that the lamp body 21 is fixedly arranged in the height adjustment barrel 1.

In the embodiment, the hold-down ring 22, which is disposed on a side of the lens holder 23, has an outer circumferential wall protruding to form an arc-shaped protruding annular ridge 221, and an annular recess 212 is formed at a corresponding position on an inner wall of the lamp body 21. Further, the protruding annular ridge 221 of the hold-down ring is engaged in the annular recess 212 of the lamp body such that the hold-down ring 22 is fixedly arranged on the lamp body 21.

In the embodiment, the heat sink 3 is mainly consisted of a sleeve 31, a stepped portion 32 radially extending at an end of the sleeve 31, screw holes 321 symmetrically formed on the stepped portion 32 and extending in parallel with the axis, an inner shoulder 33 formed with a decreased diameter at a middle portion of the sleeve 31, and a laser diode accommodation cavity 34 formed with an increasing diameter at a portion of the inner shoulder 33 proximal to the stepped portion 32.

Referring to FIG. 1, a method for assembling a laser module comprises steps as follows.

Installing a transparent protective plate 26, a light diffusion plate 25, a lens holder 23, a lens 24, and a hold-down ring 22 in an inner cavity of the lamp body 21 in sequence, wherein the protruding annular ridge 221 of the hold-down ring 22 is engaged in the annular recess 212 of the lamp body, such that the hold-down ring 22 is fixedly arranged on the lamp body 21 to assemble a lens module 2.

Installing the lens module 2 through an end of the height adjustment barrel 1 in such a manner that the protruding annular portion 211 of the lamp body is engaged in the annular groove 11 of the height adjustment barrel, such that the lens module 2 is fixedly arranged in the height adjustment barrel 1.

Pressing the laser diode 4 into the heat sink 3, and threading external threads of the heat sink 3 into internal threads of the height adjustment barrel 1.

Adjusting a focal length between the laser diode 4 and the lens 24 by threads, to achieve optimized illumination effect.

Embodiment

Figure 2:
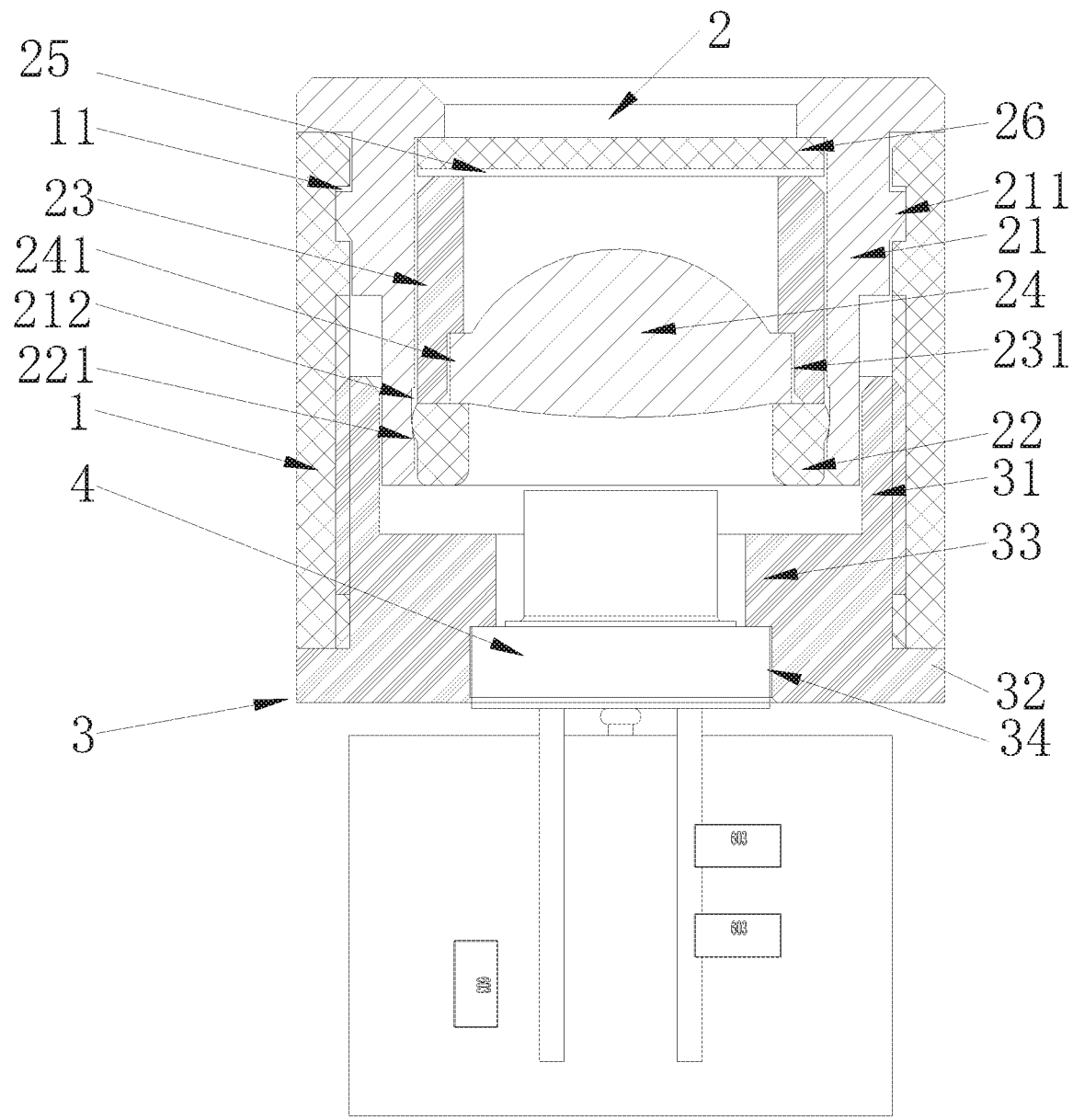
FIG. 2 is a schematic drawing of a laser module according to another embodiment of the present invention.

FIG. 2 illustrates a second embodiment of the present invention.

Referring to FIG. 2, the present embodiment differs from the previous embodiment in that an outer wall of the height adjustment barrel 1 is flush with an edge of the stepped portion 32 of the heat sink 3.

INDUSTRIAL APPLICABILITY

All the above are merely preferred embodiments of the present invention, which are not intended to limit the present invention. The present invention is intended to cover all changes, various modifications and equivalent arrangements those skilled in the art can make according to the technical essence of the present invention.

The invention claimed is:

1. A laser module, wherein a heat sink and a lens module are configured to be installed in an inner cavity of a height adjustment barrel through two ends of the height adjustment barrel, respectively, such that a laser diode received in an inner cavity of the heat sink and a lens accommodated within the lens module are disposed on a same optical axis, and the height adjustment barrel is configured to adjust a focal length between the laser diode and the lens, wherein the lens module is consisted of a lamp body, and of a transparent protective plate covering an opening end of a lens holder, a light diffusion plate, the lens holder, a lens embedded at a bottom portion of the lens holder, and a hold-down ring, which are disposed in an inner cavity of the lamp body in sequence.

2. The laser module according to claim 1, wherein a bottom portion of an inner wall of the lens holder is recessed to form an annular mounting groove, a bottom portion of the lens is formed with an annular stepped portion, and the stepped portion of the lens is engaged in the mounting groove of the lens holder.

3. The laser module according to claim 1, wherein the height adjustment barrel and the heat sink are threadingly connected.

4. The laser module according to claim 1, wherein an inner wall of the height adjustment barrel, at a position where the lens module is disposed, is recessed to form an annular groove, an outer circumferential wall of the lamp body, at a position corresponding to the annular groove of the height adjustment barrel, protrudes to form a protruding annular portion, and the protruding annular portion of the lamp body is engaged in the annular groove of the height adjustment barrel, such that the lamp body is fixedly arranged in the height adjustment barrel.

5. The laser module according to claim 1, wherein the hold-down ring, which is disposed on a side of the lens holder, has an outer circumferential wall protruding to form an arc-shaped protruding annular ridge, an annular recess is formed at a corresponding position on an inner wall of the lamp body, and the protruding annular ridge of the hold-down ring is engaged in the annular recess of the lamp body such that the hold-down ring is fixedly arranged on the lamp body.

6. The laser module according to claim 1, wherein the heat sink is consisted of a sleeve, a stepped portion radially extending at an end of the sleeve, an inner shoulder formed with a decreased diameter at a middle portion of the sleeve, and a laser diode accommodation cavity formed with an increasing diameter at a portion of the inner shoulder proximal to the stepped portion.

7. The laser module according to claim 6, wherein the stepped portion of the heat sink is provided with a screw hole extending in parallel with an axis.

8. A method for assembling a laser module, wherein the method comprises steps as follows:
- installing a transparent protective plate, a light diffusion plate, a lens holder, a lens, and a hold-down ring in an inner cavity of a lamp body in sequence, wherein a protruding annular ridge of the hold-down ring is engaged in an annular recess of the lamp body, such that the hold-down ring is fixedly arranged on the lamp body to assemble a lens module;
- installing the lens module through an end of the height adjustment barrel in such a manner that a protruding annular portion of the lamp body is engaged in an annular groove of the height adjustment barrel, such that the lens module is fixedly arranged in the height adjustment barrel;
- pressing a laser diode into a heat sink, and threading external threads of the heat sink into internal threads of the height adjustment barrel; and
- adjusting a focal length between the laser diode and the lens by threads, to achieve optimized illumination effect.

* * * * *